US 6,683,323 B2

(12) United States Patent
Kato

(10) Patent No.: US 6,683,323 B2
(45) Date of Patent: Jan. 27, 2004

(54) SEMICONDUCTOR CHIP

(75) Inventor: Takashi Kato, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/122,394

(22) Filed: Apr. 16, 2002

(65) Prior Publication Data
US 2002/0162997 A1 Nov. 7, 2002

(30) Foreign Application Priority Data
Apr. 19, 2001 (JP) ........................... 2001-121685

(51) Int. Cl.[7] .................. H01L 23/58; H01L 27/10; H01L 29/73; H01L 23/48; H01L 23/52; H01L 29/40
(52) U.S. Cl. .................. 257/48; 257/203; 257/208; 257/786
(58) Field of Search .................. 257/48, 203, 208, 257/690, 691, 692, 693, 694, 695, 696, 697, 698, 780, 782, 784, 786

(56) References Cited
U.S. PATENT DOCUMENTS
5,923,048 A * 7/1999 Inoue .......................... 257/48

2002/0149120 A1 * 10/2002 Sugiyama ................ 257/786

FOREIGN PATENT DOCUMENTS

| JP | 4-361546 | | 12/1992 | |
|---|---|---|---|---|
| JP | 09275188 | * | 10/1997 | |
| JP | 9-275188 | | 10/1997 | |
| JP | 09-275188 | * | 10/1997 | ...................... 27/4 |
| JP | 2000-58614 | | 2/2000 | |
| JP | 2000260947 | * | 9/2000 | |
| JP | 2002353321 | * | 12/2002 | |

* cited by examiner

Primary Examiner—Nathan J. Flynn
Assistant Examiner—Victor A. Mandala, Jr.
(74) Attorney, Agent, or Firm—McGinn & Gibb, PLLC

(57) ABSTRACT

To provide a semiconductor chip in which area occupied by TEG elements or area occupied by TEG-measuring electrode pads in the semiconductor chip can be reduced without reducing the number of TEG elements and complicating circuit configuration. The TEG element is formed in an empty space existing between an assembly and TEG-measuring electrode pad and the TEG-measuring electrode pad. An assembly electrode pad and the assembly and TEG-measuring electrode pad are electrically connected to a semiconductor element through internal wiring, and the assembly and TEG-measuring electrode pad and the TEG-measuring electrode pad are connected to the TEG element through an internal wiring.

13 Claims, 2 Drawing Sheets

SEMICONDUCTOR CHIP

BACKGROUND OF THE INVENTION

1. Field of the Invention

The present invention generally relates to a semiconductor device and particularly, but not limited to, a semiconductor chip having a semiconductor element and a TEG element for checking a characteristics of the semiconductor element. The present application is based on Japanese Patent Application No. 2001-121685, which is incorporated herein by reference.

2. Description of the Related Art

Conventionally, semiconductor chips have had TEG (Test Element Group) elements arranged therein for measuring and checking the characteristics of semiconductor elements used in the circuits of the chips. This is described, for example, in Japanese Patent Application Laid-Open No. Heisei 9-275188, wherein the TEG elements enable the characteristics of semiconductor chips to be checked before and after completion of the chips, thus contributing to improvement of reliability of each semiconductor chip.

Such TEG elements and the electrode pads connected to the TEG elements for measuring the characteristics of semiconductor elements (hereinafter, referred to as TEG-measuring electrode pads) are provided in semiconductor chips. Therefore, the semiconductor chips tend to increase in area due to the TEG elements and TEG-measuring electrode pads formed therein, which is negative toward the flow of demands for a compactness of semiconductor chips.

Further, with higher performance of semiconductor integrated circuits, more check items of electrical characteristics are being required for improving reliability, year after year. Thus, more TEG elements need to be included in chips in correspondence with increasing check items of characteristics. On the other hand, the increased number of TEG elements directly leads to an increase in the area of the semiconductor chips, and thus reduces wafer area available for actual semiconductor elements, causing a problem that becomes a factor driving cost up.

The problems described above are caused by a large area of a semiconductor chip occupied by TEG elements and TEG-measuring electrode pads. Thus, some attempts have been done to alleviate the problem.

That is, as methods of reducing TEG element-occupied areas, there are known two methods; one method places TEG elements in a corner portion of a semiconductor chip wherein semiconductor elements and the assembly electrode pads connected to the semiconductor elements are not placed, and the other collectively places a plurality of TEG elements in a given region of a semiconductor chip as disclosed in Japanese Patent Application Laid-Open No. Heisei 9-275188 described above.

The above described methods have not only a limit to the very effect of reducing the TEG element-occupied areas, but also a problem that the degree of area reduction by the methods is not adequate for the current circumstances where extremely various and many TEG elements are used.

On the other hand, another method of reducing area occupied by TEG-measuring electrode pads is known from Japanese Patent Application Laid-Open No. Heisei 4-361546. This application provides a technique of pad arrangement for sharing electrode pads between TEG elements, enabling six electrode pads to be used for two TEG elements, and thus reducing two electrode pads, though one TEG element usually requires four electrode pads. However, this method imposes a constraint on the arrangement of TEG elements and electrode pads therefor, and further cannot adequately reduce area occupied by TEG-measuring electrode pads.

Japanese Patent Application Laid-Open No. 2000-58614 allows reduction of the area of TEG-measuring electrode pads by sharing TEG-measuring electrode pads between a plurality of TEG elements. However, in the technique of this application, a plurality of TEG elements are vertical stacked and a mechanism of electrical switching is required for making a connection between an electrode pad and a target TEG element, thus resulting in complicated circuit design for three dimensional structure and a decreased degree of flexibility in design.

SUMMARY OF THE INVENTION

One illustrative, non-limiting embodiment of a semiconductor device attaining a circuit function of the present invention comprises: a plurality of circuit elements which are used to attain the circuit function; at least one TEG element which is not used to attain the circuit function; and a plurality of bonding pads which are used to supply and receive signals to or from the circuit elements, at least one of the bonding pads being used in common for the TEG element to supply or receive a signal to or from said TEG element.

BRIEF DESCRIPTION OF THE DRAWINGS

Features of the illustrative, non-limiting embodiments of the present invention will be more apparent from the following description taken in conjunction with the accompanying drawings, in which.

DETAILED DESCRIPTION OF THE EMBODIMENTS

The following description of the embodiments discloses specific configurations, features, and operations. However, the embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, features, and operations of the present invention that would have been known to one skilled in the art are omitted for the sake of clarity and brevity.

Figure 1:
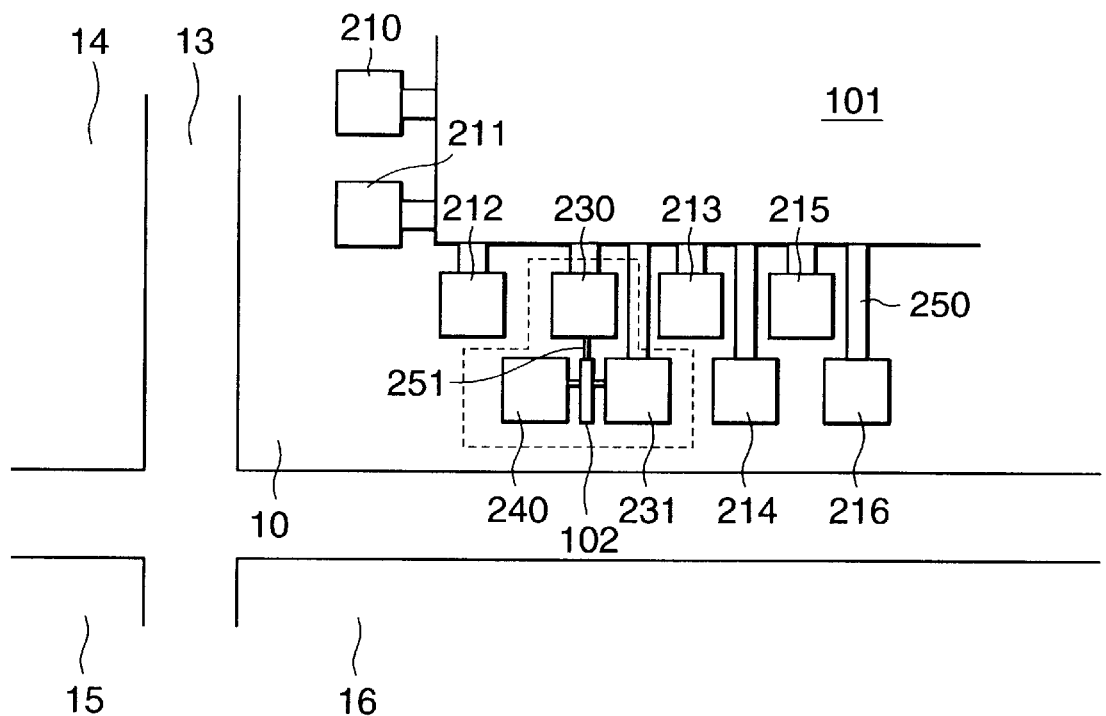
FIG. 1 is a plan view showing a semiconductor device according to a first embodiment of the present invention.

FIG. 1 shows a configuration of a semiconductor chip according to a first embodiment of the invention. A semiconductor chip 10 of the first embodiment is formed on a semiconductor wafer, and comprises a semiconductor element 101, a TEG element 102, assembly electrode pads 210 to 216, assembly and TEG-measuring electrode pads 230 and 231, a TEG-measuring electrode pad 240, and internal wiring required for each of an element and electrode pads described later. The semiconductor chip 10 is adjacent to other semiconductor chips 14, 15, and 16 with a scribing line 13 between them.

The TEG element 102 is formed in an empty space existing between the assembly and TEG-measuring electrode pad 231 and the TEG-measuring electrode pad 240. The assembly electrode pads 210 to 216 and the assembly and TEG-measuring electrode pads 230 and 231 are electrically connected to the semiconductor chip 101 through internal wiring 250. The assembly and TEG-measuring electrode pads 230 and 231 and the TEG-measuring electrode pad 240 are electrically connected to the TEG element 102 through internal wiring 251.

Further, in connection between the semiconductor chip 101 and the assembly and TEG-measuring electrode pads 230 and 231 is made by adequately selecting the TEG-measuring electrode pad 240 and the assembly and TEG-measuring electrode pads 230 and 231 so as not to affect on the semiconductor element 101 during characteristic measurement of the TEG element 102. That is, a signal (signal for measuring characteristics), externally input to a shared electrode pad between the TEG element and the semiconductor element, is supplied to the TEG element and to the semiconductor element. However, this signal for characteristic measurement does not affect on the operation of the semiconductor element. In addition, a signal, received from the TEG element by the shared electrode pad between the TEG element and the semiconductor element, is output from the shared electrode pad to the outside and also supplied to the semiconductor element. However, this signal does not affect on the operation of the semiconductor element. For example, a plurality of electrode pads electrically connected to each other without affecting on the operation of the semiconductor element are connected to one TEG element as a plurality of assembly and TEG-measuring electrodes. Also, in another example where the TEG element is a pattern for a short circuit check, any plural electrode pads can be connected to one TEG element as assembly and TEG-measuring electrode pads. This is because, when the pattern is normally fabricated, the TEG element should be open and thereby the assembly and TEG-measuring electrodes connected to the TEG element are not connected to each other.

This enables characteristic checks of semiconductor chips before and after the completion of the chips.

When semiconductor chips are mounted on packages, the assembly electrode pads are electrically connected to the electrodes of packages, for example, by conductive wires. In the first embodiment, electrode pads may be arranged in a single row in the outside region of the region in which a semiconductor element is formed, as in the case of the assembly electrode pads 210 and 211, and alternatively, electrode pads may be arranged in double arrangement of a staggered configuration in the outside region of the area in which a semiconductor element is formed, as in the case of the assembly electrode pads 212 to 216 and the assembly and TEG-measuring electrodes 230 and 231.

In either case, neither assembly electrode pad nor TEG element is preferably formed in the outside region of the region where the assembly electrode pads are formed. This is because, if elements were formed in this region where neither assembly electrode pad nor TEG element should not be formed, the element density and element accuracy of the elements formed in this region would be rougher than those of the semiconductor elements arranged in the central portion of the semiconductor chip. This roughness in element density and element accuracy is caused by a too short distance between the elements formed in this region and an alignment mark formed on a scribing line.

The double arrangement of a staggered configuration refers to a technique of arranging pads in two rows, in which the electrode pads of a first row are arranged along the outer peripheral edge of the region where semiconductor elements are formed, and each of the electrode pads of a second row arranged in the outside of the electrode pads of the first row are aligned not to each electrode pad of the first row but to a gap between adjacent electrode pads of the first row. In the first embodiment, each electrode pad is arranged at substantially equal intervals, but the invention is not limited to this arrangement.

The empty space described above refers to a region put between and among at least two electrode pads, such as a region sandwiched between the assembly and TEG-measuring electrode pad 231 and the TEG-measuring electrode pad 240. In the first embodiment, the TEG element is placed in a region sandwiched between the electrode pads 240 and 231 of the second row in the double arrangement of a staggered configuration, but the present invention is not limited to this placement. For example, the TEG element may be placed in a region sandwiched between two electrode pads of the first row in the double arrangement of a staggered configuration.

The TEG element comprises several kinds of transistors, elements such as an aluminum resistor, and wiring connecting them to each other. The TEG element is formed through all processes for forming semiconductor elements on a semiconductor wafer or through partial processes thereof. On the basis of measured values of electrical characteristics of the TEG element, the electrical characteristics of a semiconductor element in the same wafer can be estimated. The various electrical characteristics include process parameters, such as characteristic values of a single transistor, wiring capacitance, and contact resistance, for example. A pass/fail decision of a device and controlling of the process are performed based on these characteristic values. In the first embodiment, the size of the TEG elements is smaller than that of the electrode pads, so that the TEG elements can be arranged at an empty space between electrode pads.

The semiconductor element described above refers to an element achieving a circuit function to be implemented by a semiconductor chip.

The internal wiring refers to aluminum wiring or the like formed on a semiconductor substrate.

As described above, the semiconductor chip according to the first embodiment does not require a dedicated region provided for the TEG element 102, thereby allowing reduction of TEG-element-occupied areas. Further, although the first embodiment requires three electrode pads connected to the TEG element 102, the three pads all need not to be dedicated to the TEG element, but two of them are shared with the assembly electrode pads of the semiconductor chip 10. This allows partial omission of electrode pads, thus reducing the areas occupied by the TEG-measuring electrode pads. Further, in the first embodiment, because the TEG element and the corresponding electrode pads are adjacent to each other, it is possible to shorten the length of internal wiring. Therefore, it is possible to reduce spaces required for connections, thus increasing the degree of flexibility in design. In this way, the semiconductor chip according to the first embodiment allows a reduction in the size of semiconductor chips and an improvement in the chip yield per wafer.

Although FIG. 1 shows an example including one set of the TEG element and the corresponding electrode pads, a plurality of TEG elements can be arranged and wired between electrode pads in a semiconductor chip according to the number of required TEG elements.

Figure 2:
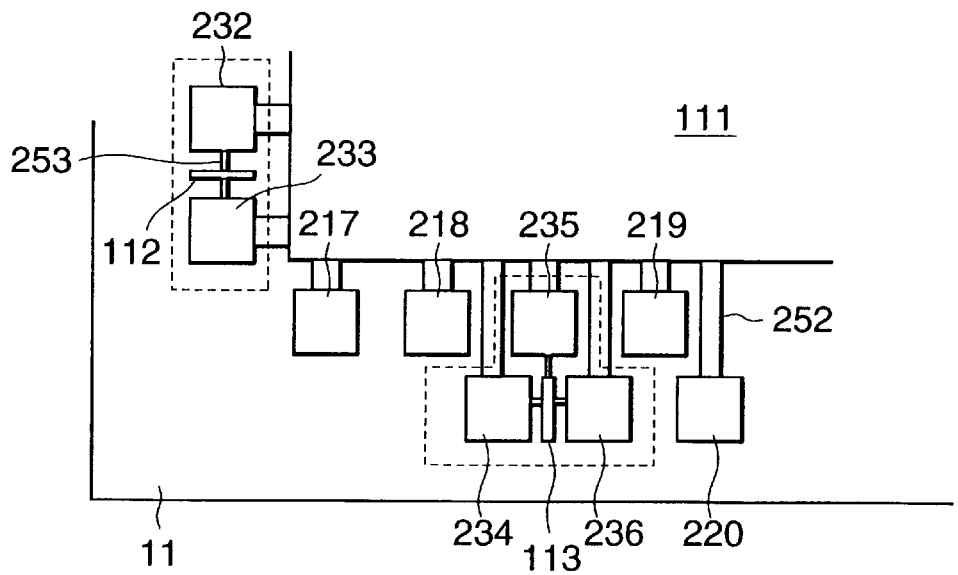
FIG. 2 is a plan view showing a semiconductor device according to a second embodiment of the present invention.

FIG. 2 shows a configuration of a semiconductor chip according to a second embodiment of the present invention. A semiconductor chip 11 of the second embodiment comprises a semiconductor element 111, TEG elements 112 and 113, assembly electrode pads 217 to 220, assembly and TEG-measuring electrode pads 232 to 236, and internal wiring required for each element and electrode pad described later.

The TEG element 112 is formed in an empty space existing between the assembly and TEG-measuring electrode pads 232 and 233. The TEG element 113 is formed in an empty space existing between the assembly and TEG-measuring electrode pads 234 and 236. The sizes of the TEG elements are smaller than those of the electrode pads and can be put enough in an empty space between the electrode pads. The assembly electrode pads 217 to 220 and the assembly and TEG-measuring electrode pads 232 to 236 are electrically connected to the semiconductor element 111 through the internal wiring 252. The assembly and TEG-measuring electrode pads 232 and 233 are electrically connected to the TEG element 112 through the internal wiring 253. The assembly and TEG-measuring electrode pads 234 to 236 are electrically connected to the TEG element 113 through the internal wiring 253. Further, in measuring the characteristics of the TEG elements 112 and 113, a connection between the semiconductor element 111 and the assembly and TEG-measuring electrode pads 232 and 233, and a connection between the semiconductor element 111 and the assembly and TEG-measuring electrode pads 234 to 236 each are made by selecting the assembly and TEG-measuring electrode pads 232 and 233 and the assembly and TEG-measuring electrode pads 234 to 236 so as not to affect on the semiconductor element 111. This enables characteristic checks of semiconductor chips before and/or after the completion of the chips.

As shown in FIG. 2, the assembly electrode pads 217 to 220 and the assembly and TEG-measuring electrode pads 232 to 236 may be arranged in a single row or in double arrangement of a staggered configuration in the outside region of the region in which the semiconductor element is formed.

As described above, the semiconductor chip according to the second embodiment does not require a dedicated region provided for the TEG elements 112 and 113, thus allowing reduction of the areas occupied by TEG elements. Also, in the second embodiment, all the electrode pads connected to the TEG elements 112 and 113 are shared with the assembly electrode pads for the semiconductor chip 111. This enables a great reduction of the areas occupied by TEG-measuring electrode pads. Further, in the second embodiment, the TEG elements and the corresponding electrode pads are adjacent to each other, thereby reducing the length of internal wiring. Therefore, spaces required for connections can be reduced, thus increasing the degree of flexibility in design. In this way, the semiconductor chip according to the second embodiment allows a reduction in the size of semiconductor chips and an increase in chip yield per wafer.

Although FIG. 2 shows an example including one set of the TEG elements requiring respectively two and three measuring electrode pads, a plurality of TEG elements can be arranged and wired between electrode pads in a semiconductor chip according to the number of required TEG elements.

Figure 3:
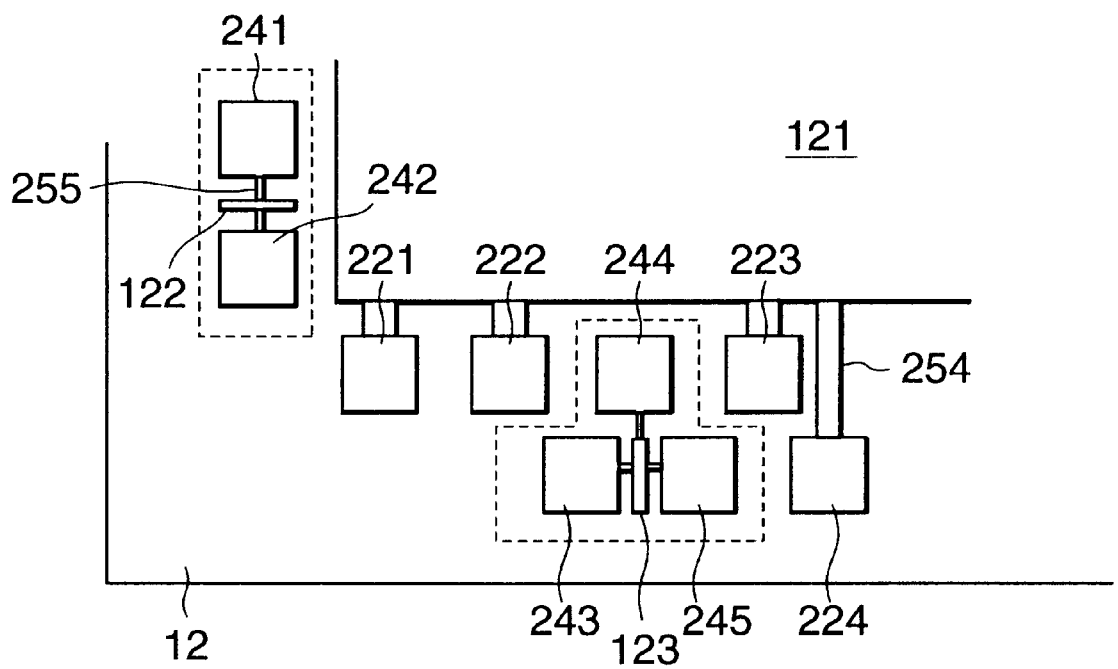
FIG. 3 is a plan view showing a semiconductor device according to a third embodiment of the present invention.

FIG. 3 shows a configuration of a semiconductor chip according to a third embodiment of the present invention. A semiconductor chip 12 of the third embodiment comprises a semiconductor element 121, TEG elements 122 and 123, assembly electrode pads 221 to 224, TEG-measuring electrode pads 241 to 245, and internal wiring required for each element and electrode pad described later.

The TEG element 122 is formed in an empty space existing between the TEG-measuring electrode pads 241 and 242. The TEG element 123 is formed in an empty space existing between the TEG-measuring electrode pads 243 and 245. The sizes of the TEG elements are smaller than those of the electrode pads and thus can be put enough in an empty space between the electrode pads. The assembly electrode pads 221 to 224 are electrically connected to the semiconductor element 121 through the internal wiring 254. The TEG-measuring electrode pads 241 and 242 are electrically connected to the TEG element 122 through the internal wiring 255. The TEG-measuring electrode pads 243 to 245 are electrically connected to the TEG 123 through the internal wiring 255. This enables characteristic checks of semiconductor chips regardless of before and/or after the completion of the chips.

As shown in FIG. 3, the assembly electrode pads 221 to 224 and the TEG-measuring electrode pads 241 to 245 may be arranged in a single row or in double arrangement of a staggered configuration in the outside region of the region in which the semiconductor element is formed.

As described above, the semiconductor chip according to the third embodiment does not require a dedicated-region provided for the TEG elements 122 and 123, thus allowing reduction of the areas occupied by the TEG elements. Further, the TEG-measuring electrode pads 241 to 245 are provided in empty spaces in the semiconductor chip. Alternatively, an original assembly electrode pad for the semiconductor chip, which has been now unused as the assembly electrode due to design change or the like, is made use of as a TEG-measuring pad as it is. In either case, a new pad is not provided. That is, no addition of a new electrode pad prevents an increase in the area of semiconductor chips. Further, in the third embodiment, the TEG elements and the corresponding electrode pads are adjacent to each other, thereby allowing reduction of the length of internal wiring. Therefore, spaces required for connections can be reduced, thus increasing the degree of flexibility in design. In this way, the semiconductor chip according to the third embodiment allows a reduction in the size of semiconductor chips and an increase in chip yield per wafer.

Although FIG. 3 shows an example including one set of the TEG elements requiring respectively two and three measuring electrode pads, a plurality of TEG elements can be arranged and wired between electrode pads in a semiconductor chip according to the number of required TEG elements.

The present invention is not limited to the above embodiments, and it is contemplated that numerous modifications may be made without departing from the spirit and scope of the invention. The semiconductor device, as described above with reference to the figures, is a merely an exemplary embodiment of the invention, and the scope of the invention is not limited to these particular embodiments. For example, the specific layers and materials that are used to create the semiconductor devices of the non-limiting embodiments are merely examples, and one skilled in the art will readily know that the present invention can be applied to devices containing different layers and materials. Accordingly, other structural configurations may be used, without departing from the sprit and scope of the invention as defined in the claims.

What is claimed:

1. A semiconductor device attaining a circuit function, comprising:
   a plurality of circuit elements which are used to attain said circuit function;
   at least one Test Element Group (TEG) element which is not used to attain said circuit function; and
   a plurality of bonding pads, each of which is used to supply or receive signals to or from said plurality of circuit elements, at least one of said bonding pads being shared with supplying or receiving a signal to or from said TEG element,
   wherein said plurality of bonding pads are formed in a linear arrangement and said TEG element is formed between two of said plurality of bonding pads.

2. The semiconductor device as claimed in claim 1, wherein one of said two of said plurality of bonding pads, between which said TEG element is formed, is shared with supplying or receiving a signal to or from said TEG element.

3. The semiconductor device as claimed in claim 1, wherein said bonding pads are formed in line along an edge of an area where said circuit elements are formed.

4. A semiconductor device attaining a circuit function, comprising:
   a plurality of circuit elements which are used to attain said circuit function;
   at least one Test Element Group (TEG) element which is not used to attain said circuit function; and
   a plurality of bonding pads, each of which is used to supply or receive signals to or from said circuit elements, at least one of said bonding pads being shared with supplying or receiving a signal to or from said TEG element,
   wherein said bonding pads are formed in a linear arrangement at substantially regular intervals and said TEG element is formed between two of said bonding pads.

5. The semiconductor device as claimed in claim 4, wherein one of said two bonding pads, between which said TEG element is formed, is shared with supplying or receiving a signal to or from said TEG element.

6. A semiconductor device comprising:
   an area in which a plurality of circuit elements are formed to configure a functional circuit;
   a first set of bonding pads formed in line along a side of said area, plural ones of said first set of bonding pads being used to supply or receive signals to or from said functional circuit;
   a second set of bonding pads formed in line along said side of said area, said first set of bonding pads being arranged between said side of said area and said second set of bonding pads, plural ones of said second set of bonding pads being used to supply or receive signals to or from said functional circuit; and
   a Test Element Group (TEG) element formed between an adjacent two of said second set of bonding pads, said TEG element having a first electrode connected to one of said adjacent two of said second set of bonding pads, a second electrode connected to the other of said adjacent two of said second set of bonding pads and a third electrode connected to one of said first set of bonding pads.

7. The device as claimed in claim 6, wherein said one of said adjacent two of said second set of bonding pads, to which said first electrode of said TEG element is connected, is shared with supplying or receiving a signal to or from said functional circuit.

8. The device as claimed in claim 6, wherein said one of said first set of bonding pads, to which said third electrode of said TEG element is connected, is shared with supplying or receiving a signal to or from said functional circuit.

9. The device as claimed in claim 6, wherein said one of said adjacent two of said second set of bonding pads, to which said first electrode of said TEG element is connected, is shared with supplying or receiving a signal to or from said functional circuit and said one of said first set of bonding pads, to which said third electrode of said TEG element is connected, is shared with supplying or receiving another signal to or from said functional circuit.

10. The device as claimed in claim 6, wherein said one of said adjacent two of said second set of bonding pads, to which said first electrode of said TEG element is connected, is shared with supplying or receiving a first signal to or from said functional circuit,
    wherein said other of said adjacent two of said second set of bonding pads, to which said second electrode of said TEG element is connected, is shared with supplying or receiving a second signal to or from said functional circuit, and
    wherein said one of said first set of bonding pads, to which said third electrode of said TEG element is connected, is shared with supplying or receiving a third signal to or from said functional circuit.

11. A semiconductor device with a functional circuit, said device comprising:
    a first set of bonding pads arranged linearly;
    a second set of bonding pads arranged parallel to said first set of bonding pads; and
    a Test Element Group (TEG) element formed between an adjacent two of said second set of bonding pads,
    wherein said TEG element comprises a first electrode connected to one of said adjacent two of said second set of bonding pads, a second electrode connected to the other of said adjacent two of said second set of bonding pads, and a third electrode connected to one of said first set of bonding pads.

12. The device as claimed in claim 11, wherein plural ones of said first set of bonding pads and plural ones of said second set of bonding pads are connected to said functional circuit for supplying or receiving signals.

13. The device as claimed in claim 12, wherein at least one of said plural ones of said first set and said second set of bonding pads, used to supply or receive signals to or from the functional circuit, is shared with supplying or receiving a signal to or from the TEG element.

* * * * *